US005401965A

United States Patent [19]

Kaneko et al.

[11] Patent Number: 5,401,965

[45] Date of Patent: Mar. 28, 1995

[54] SECONDARY ION MASS SPECTROMETER FOR ANALYZING POSITIVE AND NEGATIVE IONS

[75] Inventors: Kazuhiko Kaneko; Hideaki Hayashi, both of Kanagawa; Kazutoshi Nagai, Tokyo, all of Japan

[73] Assignee: Ebara Corporation, Tokyo, Japan

[21] Appl. No.: 27,242

[22] Filed: Mar. 3, 1993

[30] Foreign Application Priority Data

Mar. 4, 1992 [JP] Japan .................................. 4-081410

[51] Int. Cl.[6] .............................................. H01J 37/244

[52] U.S. Cl. ...................................................... 250/309

[58] Field of Search ......................... 250/309, 281, 397

[56] References Cited

U.S. PATENT DOCUMENTS

| | | | |
|---|---|---|---|
| 3,742,227 | 6/1973 | Benninghoven | 250/282 |
| 4,266,127 | 5/1981 | Chang | 250/288 |
| 4,704,526 | 11/1987 | Kyogoku et al. | 250/309 |
| 4,841,143 | 6/1989 | Tamura et al. | 250/309 |
| 4,988,867 | 1/1991 | Laprade | 250/281 |
| 5,208,457 | 5/1993 | Tsuji | 250/309 |

FOREIGN PATENT DOCUMENTS

| | | |
|---|---|---|
| 2246976 | 5/1975 | France . |
| 2339249 | 8/1977 | France . |

OTHER PUBLICATIONS

Patent Abstracts of Japan, vol. 11, No. 217 (E523) 14 Jul. 1987 & JP-A-62 037 860 (Nippon Telegr. and Teleph.) 18 Feb. 1987.

International Laboratory, vol. 18, No. 5, Jun. 1988, Fairfield CT US, pp. 26-32, D. Williams, "An Automated Hybrid Mass Spectrometer with a User-Oriented Interface".

Satake et al., "A Simple Ion Energy Analyser Equipped with a Quadrupole Mass Spectrometer", *Japanese Journal of Applied Physics,* vol. 15, No. 7, Jul. 1976, pp. 1359-1366.

Wittmaack et al., "A Low Background Secondary Ion Mass Spectrometer with Quadrupole Analyser", *International Journal of Mass Spectrometry and Ion Physics,* 11 (1973), pp. 23-35.

Schubert et al., "A Simple, Inexpensive SIMS Apparatus", *The Review of Scientific Instruments,* vol. 44, No. 4, Apr. 1973, pp. 487-491.

*Primary Examiner*—Bruce C. Anderson

*Attorney, Agent, or Firm*—Wenderoth, Lind & Ponack

[57] ABSTRACT

A secondary ion mass spectrometer analyzes secondary ions by separating and detecting positive and negative secondary ions generated from a sample when the sample is irradiated with a high speed primary beam. The sample is irradiated with a primary beam such as a high speed atom beam and secondary ions are emitted from the sample. The emitted secondary ions are separated and detected by a quadrupole mass spectrometer. Downstream of the quadrupole mass spectrometer, a plurality of metallic rod electrodes are provided parallel to each other, some of which are supplied with a positive voltage and the rest of which are supplied with a negative voltage. An electrostatic shield surrounds the metallic rod electrodes. The secondary ions are separated into positive and negative secondary ions by the electric fields formed by the metallic rod electrodes. The separated secondary ions are respectively converted into currents by corresponding secondary electron multipliers or Faraday cups.

8 Claims, 3 Drawing Sheets

SECONDARY ION MASS SPECTROMETER FOR ANALYZING POSITIVE AND NEGATIVE IONS

BACKGROUND OF THE INVENTION

1. Field of the Invention

The present invention relates to a secondary ion mass spectrometer, and more specifically, to a secondary ion mass analyzer for analyzing a sample by irradiating the sample with a primary beam, such as a high speed atom beam, and simultaneously separating and detecting both positively and negatively charged secondary ions emitted from the sample.

2. Description of the Prior Art

FIG. 1 schematically illustrates the structure of a secondary ion mass spectrometer of the prior art. In this figure, reference numeral 1 designates a high speed beam source for emitting a high speed atom beam, 2 an analyzing tube, 3 a sample, 4 a quadrupole mass spectrometer, 5 a secondary electron multiplier, 8 an amplifier, 7 a recorder, 8 a vacuum pump, 9 a high speed atom beam, and 10 secondary ions generated when the sample is irradiated with the high speed atom beam.

This secondary ion mass spectrometer of the prior art operates as follows. An analyzing tube 2 and a quadrupole mass spectrometer 4 are sufficiently evacuated with a vacuum pump 8. A beam source 1 emits a high speed atom beam 9 to irradiate a sample 8. Secondary ions 10 are emitted from the sample 8 which is irradiated and bombed by the high speed beam 9 and these ions are discriminated by the quadrupole mass spectrometer 4, whereby only the secondary ions having a particular mass are selected and enter a secondary electron multiplier 5. Secondary ions 10 are converted into electrons equivalent to the input secondary ions in the secondary electron multiplier 5 and the output is fed through an amplifier 8 and finally recorded by a recorder 7.

Such a secondary ion mass spectrometer is used for mass analysis of secondary ions generated from a solid surface of a sample irradiated with a high speed beam. This analyzing method provides extremely high sensitivity in comparison with other surface analyzing methods such as Auger electron spectroscopy and X-ray electron spectroscopy, and is characterized by its ability to analyze all of the elements of the periodic table and isotopes. Particularly, a high speed atom beam having energy of several hundred electron volts to several kiloelectron volts is suitable for mass analysis because it is electrically neutral and therefore is not influenced by a charged insulator, and the range of the orbit of the atom beam remains constant as the atom beam is not influenced by space charges.

However, a secondary ion mass spectrometer of the prior art does not separate both positively and negatively charged secondary ions, although both positively and negatively charged secondary ions are simultaneously emitted from a sample. Therefore, positively charged secondary ions cannot be detected when negatively charged secondary ions are detected, and vice versa. Accordingly, when it is required to obtain a mass spectra of secondary ions of different polarities from one sample, analysis must be conducted twice, whereby the operation is complex and cannot be carried out swiftly.

SUMMARY OF THE INVENTION

In view of the foregoing problems of the prior art, it is an object of the present invention to provide a secondary ion mass spectrometer which simultaneously separates and detects both positively and negatively charged secondary ions emitted from a sample.

In order to achieve the object mentioned above, the present invention provides a secondary ion mass spectrometer comprising a mass-separating means for mass-separating secondary ions emitted from a sample irradiated with a high speed primary beam, and a charge separating means for receiving the secondary ions separated by the mass-separating means to charge-separate such secondary ions into positively charged and negatively charged secondary ions whereby currents corresponding to the quantities of the separated positive and negative secondary ions can be generated.

The present invention also provides a secondary ion mass analyzer comprising (1) a means for irradiating a sample with a high speed primary beam, (2) a mass-separating means for separating and detecting the secondary ions emitted from the sample, (3) an ion separator means arranged downstream of the mass-separating means and including a plurality of metal electrodes extending parallel to each other and supplied with positive and negative voltages and an electrostatic shield surrounding the metal electrodes and having an ion entering hole facing the mass-separating means and ion exiting holes, and (4) ion-current converting means facing the respective ion exiting holes.

In a preferred embodiment of the present invention, four metal electrodes are arranged at four apices of a rectangle. A positive voltage is applied to the electrodes located on one diagonal of the rectangle while a negative voltage is applied to the electrodes located on the other diagonal thereof.

In another embodiment of the present invention, two metal electrodes are used and a positive voltage is applied to one metal electrode while a negative voltage is applied to the other metal electrode.

The ion-current converting means is a secondary electron multiplier or a Faraday cup.

In a secondary ion mass spectrometer of the present invention, in order to detect secondary ions comprising positively and negatively charged secondary ions emitted from a sample, the positively and negatively charged secondary ions pass through a charge separating means for separating the positively and negatively charged secondary ions with electric fields formed by metallic electrodes to which positive and negative voltages are applied. This enables simultaneous detection of both secondary ions, thereby realizing swift and efficient mass analysis.

The above and further objects and features of the present invention will become more apparent from the following detailed description with reference to the accompanying drawings.

DETAILED DESCRIPTION OF THE PREFERRED EMBODIMENTS

Figure 1:
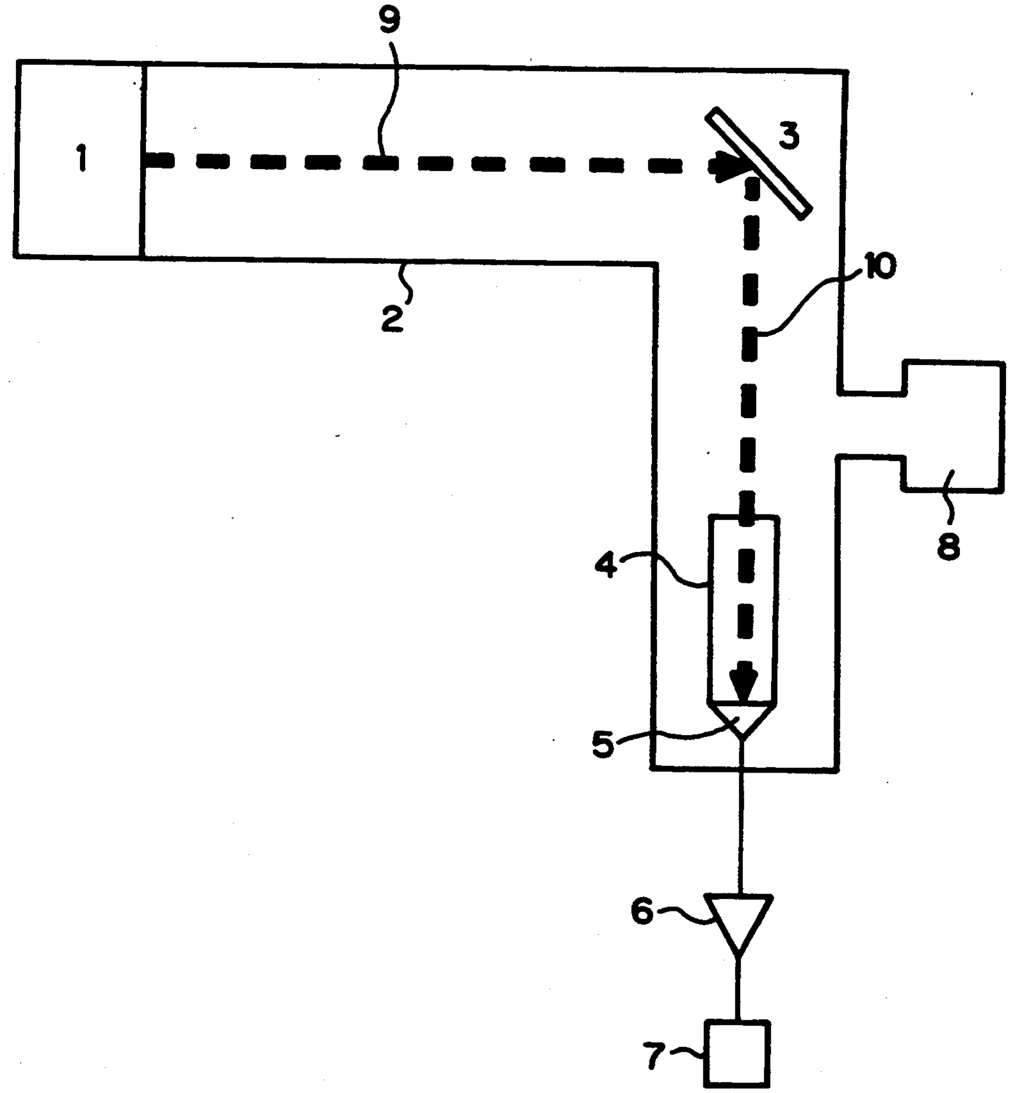
Fig. 1 PRIOR ART
FIG. 1 schematically illustrates the structure of a secondary ion mass analyzer of the prior art.
Figure 2:
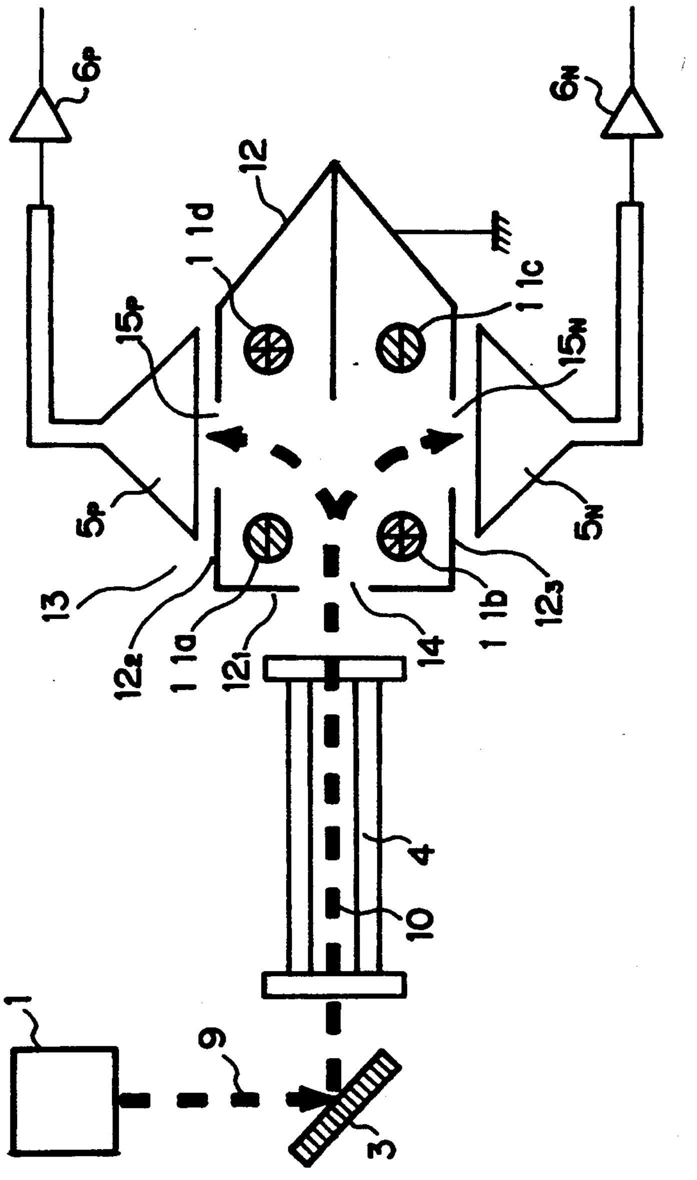
FIG. 2 schematically illustrates the structure of the first embodiment of a secondary ion mass analyzer according to the present invention.

FIG. 2 schematically illustrates the structure of the first embodiment of a secondary ion mass analyzer according to the present invention. A high speed atom beam source 1 generates a high speed atom beam 9 and a sample 3 is irradiated with this atom beam.

Positive and negative secondary ions 10 generated when the sample 3 is irradiated with the beam 9 are discriminated by a quadrupole mass spectrometer 4 and separated into positive ions and negative ions by a charge separator 13. The separated positive and negative ions are then input to corresponding secondary electron multipliers or Faraday cups $5_P$, $5_N$, which in turn convert those ions into currents corresponding to the quantity of the input secondary ions. These currents are then amplified by amplifiers $6_P$, $6_N$ and are recorded as mass spectra by a recorder (not illustrated).

The charge separator 13 is provided with four metallic rod electrodes 11*a*, 11*b*, 11*c*, 11*d* extending parallel to each other in the direction perpendicular to the paper surface, and an electrostatic shield member 12 surrounding the metallic rod electrodes. These four metallic rod electrodes 11*a*, 11*b*, 11*c*, 11*d* are respectively disposed at the apices of a rectangle. Of the wall surfaces of the electrostatic shielding member 12, wall surface $12_1$ facing the quadrupole mass spectrometer 4 has a secondary ion entering hole 14, while the two wall surfaces $12_2$, $12_3$ adjacent to wall surface $12_1$ have secondary ion exiting holes $15_P$, $15_N$. The secondary ion exiting hole $15_P$ is faced by the secondary electron multiplier or Faraday cup $5_P$ in order to receive positive secondary ions separated by charge separator 13, and the secondary electron multiplier or Faraday cup $5_N$ faces the secondary ion exiting hole $15_N$ to receive negative secondary ions. A positive voltage is applied from a power source to two of the electrodes 11*a* to 11*d* disposed on one diagonal of the aforementioned rectangle while a negative voltage is applied to the remaining two electrodes disposed on the other diagonal. Electric fields are thus generated within the electrostatic shield member 12 to separate positive and negative ions, respectively, in different directions.

Specifically, positive and negative secondary ions 10 discriminated by the quadrupole mass spectrometer 4 enter the electrostatic shield member 12 through the secondary ion entering hole 14. A negative voltage is applied, for example, to two electrodes 11*a*, 11*c* disposed on one diagonal of the rectangle formed by the four metallic rod electrodes 11*a*, 11*b*, 11*c*, 11*d*, while a positive voltage is applied to the remaining two electrodes 11*b*, 11*d*. The positive secondary ions pass through the secondary ion entering hole 14 and then through the ion incident plane formed by metallic rod electrodes 11*a*, 11*b*, and are directed to the upper side of FIG. 2 by the electric field formed by the four metallic rod electrodes 11*a* to 11*d*, while the negative secondary ions are directed to the lower side of FIG. 2. The positive secondary ions thus separated pass through the secondary ion exiting plane formed by metallic rod electrodes 11*a*, 11*d* and then through secondary ion exiting holes $15_P$ of the electrostatic shield member 12 and then enter secondary electron multiplier or Faraday cup $5_P$. In a similar manner, the negative secondary ions pass through the secondary ion exiting plane formed by metallic rod electrodes 11*b*, 11*c* and then through secondary ion exiting hole $15_N$ and then enter secondary ion multiplier or Faraday cup $5_N$.

The positive and negative secondary ions entering the secondary electron multipliers or Faraday cups $5_P$, $5_N$ are respectively converted into currents corresponding to the quantity of secondary ions and these currents are then amplified by amplifiers $6_P$, $6_N$. The outputs of the amplifiers $6_P$, $6_N$ are supplied to a recorder, whereby the quantity of positive and negative secondary ions is respectively recorded as mass spectra.

According to the result of a computer simulation, in the case where the intervals between the metallic rod electrodes 11*a*, 11b, 11*c*, 11*d* are set at about several centimeters and voltages of $\pm 50$ V are applied to these metallic rod electrodes to form electric fields in the electrostatic shield member 12, it has been confirmed that secondary ions of 10 to 35 electron volts are distinctively separated into positive and negative secondary ions, which respectively enter the corresponding secondary electron multipliers or Faraday cups $5_P$, $5_N$.

Figure 3:
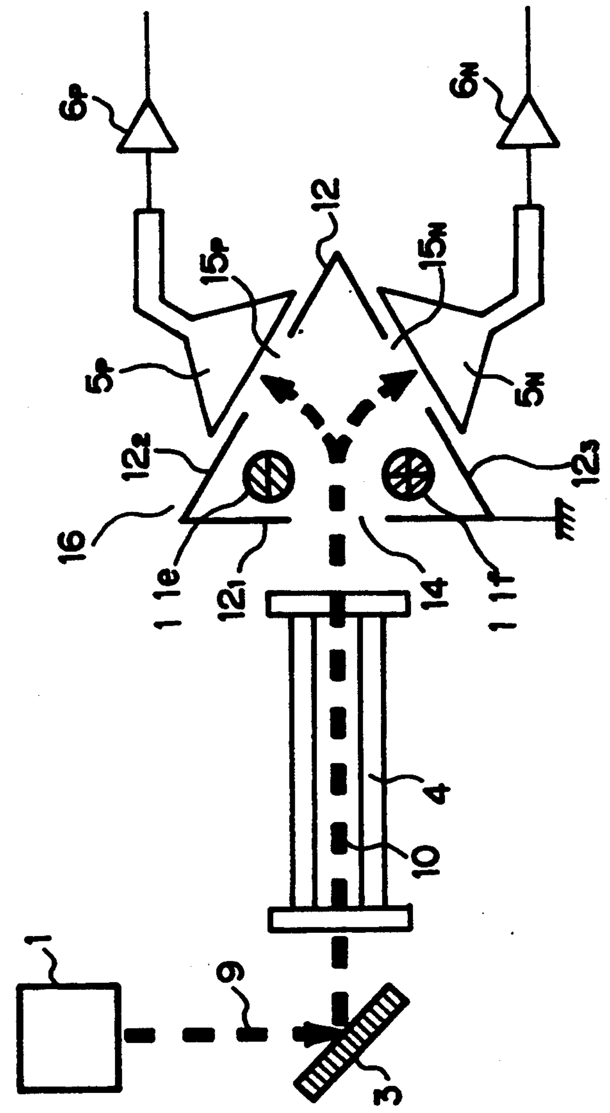
FIG. 3 schematically illustrates the structure of the second embodiment of a secondary ion mass analyzer according to the present invention.

FIG. 3 schematically illustrates the structure of the second embodiment of a secondary ion mass analyzer according to the present invention. The charge separator 13 comprises two metallic rod electrodes 11*e*, 11*f* which extend parallel to each other in the direction perpendicular to the paper surface and an electrostatic shield member 12 having three wall surfaces surrounding the metallic rod electrodes. Wall surface $12_1$ facing quadrupole mass spectrometer 4 has a secondary ion entering hole 14 and the two wall surfaces $12_2$, $12_3$ adjacent to wall surface $12_1$ respectively have secondary ion exiting holes $15_P$, $15_N$. The secondary ion exiting holes $15_P$ are forced by $15_N$, secondary electron multipliers or Faraday cups $5_P$, $5_N$, respectively. A power supply is connected such that a positive voltage is applied to one electrode $11_f$ and a negative voltage to the other electrode $11_e$.

With a process similar to that of the first embodiment illustrated in FIG. 2, positive and negative secondary ions are discriminated by the quadrupole mass spectrometer 4. The discriminated secondary ions enter the electrostatic shield member 12 through the secondary ion entering hole 14. The positive secondary ions pass through the plane formed by metallic rod electrodes $11_e$, $11_f$ and are directed to the upper side of the figure due to tile electric field generated by the same electrodes, while the negative secondary ions are directed to the lower side thereof. As a result, the positive and negative secondary ions are respectively separated in different directions. The separated secondary ions enter corresponding secondary electron multipliers or Faraday cups $5_P$, $5_N$, respectively, and are then converted into currents corresponding to the quantities of the respective ions. These currents are respectively amplified by amplifiers $6_P$, $6_N$ and recorded as mass spectra by the recorder.

As explained above in detail, according to a secondary ion mass spectrometer of the present invention, both positive and negative secondary ions emitted in combination are separated in different directions and can thereby be detected simultaneously, enabling secondary ion mass spectra of the positive and negative secondary ions to be obtained completely at one time. As a result, mass spectrum analysis can be done more swiftly and more reliable data can be obtained than in the prior art.

What is claimed is:

1. A secondary ion mass spectrometer comprising: a high speed primary beam source oriented to irradiate a sample with a high speed primary beam; a mass-separating means for discriminating secondary ions emitted from the sample; an ion separator arranged downstream of said mass-separating means and including a plurality of metal electrodes extending parallel to each other, and an electrostatic shield surrounding said metal electrodes, said shield having an ion entering hole facing said mass-separating means and ion exiting holes; a power supply connected to said electrodes to supply the electrodes with positive and negative voltages, whereby the electrodes will separate the discriminated secondary ions into positive and negative secondary ions; and an ion-current converting means for converting the positive and negative secondary ions coming out of said exiting holes to currents corresponding to the quantities of the respective secondary ions.

2. A secondary ion mass spectrometer according to claim 1, wherein the number of said metal electrodes is four, said metal electrodes are disposed at four apices of a rectangle, and said power source applies a positive voltage to two electrodes located on one diagonal of said rectangle and a negative charge to the remaining two electrodes located on the other diagonal.

3. A secondary ion mass spectrometer according to claim 2, wherein said ion-current converting means comprises secondary electron multipliers.

4. A secondary ion mass spectrometer according to claim 2, wherein said ion-current converting means comprises Faraday cups.

5. A secondary ion mass spectrometer according to claim 1, wherein the number of said metal electrodes is two, and said power source applies a positive voltage to one of said metal electrodes and a negative voltage to the other electrode.

6. A secondary ion mass spectrometer according to claim 5, wherein said ion-current converting means comprises secondary electron multipliers.

7. A secondary ion mass spectrometer according to claim 5, wherein said ion-current converting means comprises Faraday cups.

8. A secondary ion spectrometer comprising: a mass-separating means for discriminating secondary ions emitted from a sample when said sample is irradiated with a high speed primary beam; an electrode group disposed downstream of said mass-separating means so as to receive the discriminated secondary ions, said electron group including a plurality of electrodes; a power source connected to said electron group so as to apply a positive voltage to an electrode of the electrode group and a negative voltage to another electrode of the electrode group; and an electrostatic shield surrounding said electrode group, said electrostatic shield having a secondary ion entering hole through which the secondary ions discriminated by said mass-separating pass and secondary ion exiting holes through which positive and negative secondary ions separated from one another by said electrode group pass, respectively, to the outside of said shield.

* * * * *